United States Patent [19]

Wen et al.

[11] Patent Number: 5,026,148
[45] Date of Patent: Jun. 25, 1991

[54] HIGH EFFICIENCY MULTIPLE QUANTUM WELL STRUCTURE AND OPERATING METHOD

[75] Inventors: Cheng P. Wen, Mission Viego; Chan-Shin Wu, Torrance; Robert N. Sato, Palos Verdes Estates, all of Calif.

[73] Assignee: Hughes Aircraft Company, Los Angeles, Calif.

[21] Appl. No.: 457,207

[22] Filed: Dec. 26, 1989

[51] Int. Cl.$^5$ .............................................. G02B 5/30
[52] U.S. Cl. .................................... 350/386; 350/385; 350/378
[58] Field of Search ............................. 350/370–378, 350/355, 356, 394, 395, 162.23, 164, 96.13, 386, 388, 389; 372/50, 45; 357/16, 18

[56] References Cited

U.S. PATENT DOCUMENTS

| | | | |
|---|---|---|---|
| 4,025,939 | 5/1977 | Aiki et al. | 357/18 |
| 4,525,687 | 6/1985 | Chemla et al. | 357/16 |
| 4,915,482 | 4/1990 | Collins et al. | 350/355 |

FOREIGN PATENT DOCUMENTS 0249645 12/1987 European Pat. Off. .

OTHER PUBLICATIONS

"Physics and Application of Quantum Wells in Waveguides", J. S. Weiner, SPIE, vol. 578, Integrated Optical Circuit Engineering II (1985), pp. 116–121.

Primary Examiner—Bruce Y. Arnold
Assistant Examiner—James Phan
Attorney, Agent, or Firm—Terje Gudmestad; Jeannette M. Walder; W. K. Denson-Low

[57] ABSTRACT

A multiple quantum well photodetector structure has superlattice which absorbs radiation polarized non-parallel to the superlattice during a first pass. Non-absorbed radiation polarized parallel to the superlattice is reflected back into the superlattice at a cross-angle to its incident angle, with its polarization shifted to a substantially non-parallel angle to the superlattice. At least part of this radiation is absorbed during its second pass through the superlattice, thereby increasing the efficiency of the device. An optical back grating is used to perform the cross-angle reflection, and a front grating may also be used to shift an incoming beam which is initially normal to the superlattice to an angle at which part of the beam is absorbed. The front grating is at a cross-angle to the back grating to enable a cross-angular shift by the back grating.

15 Claims, 3 Drawing Sheets

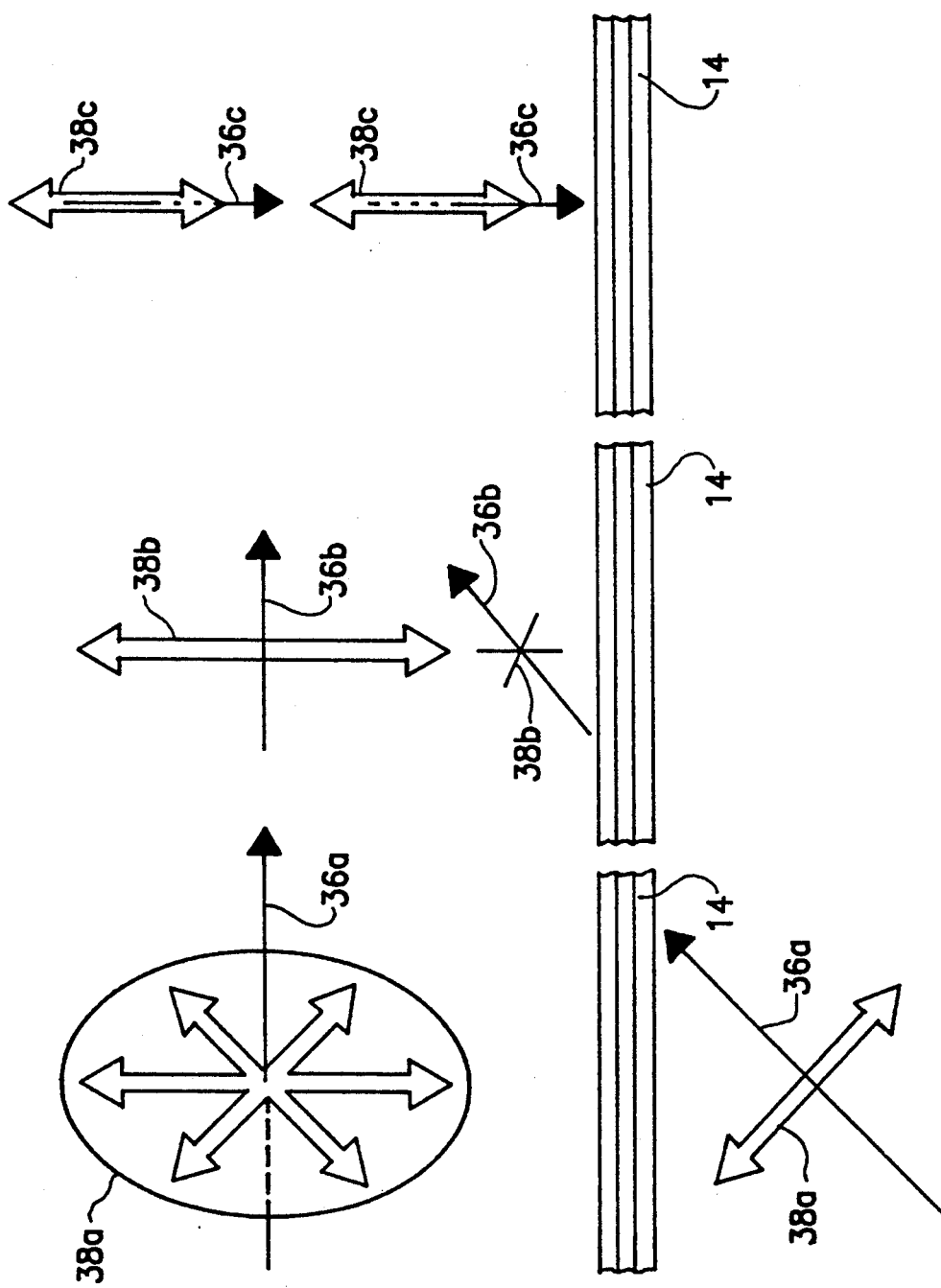

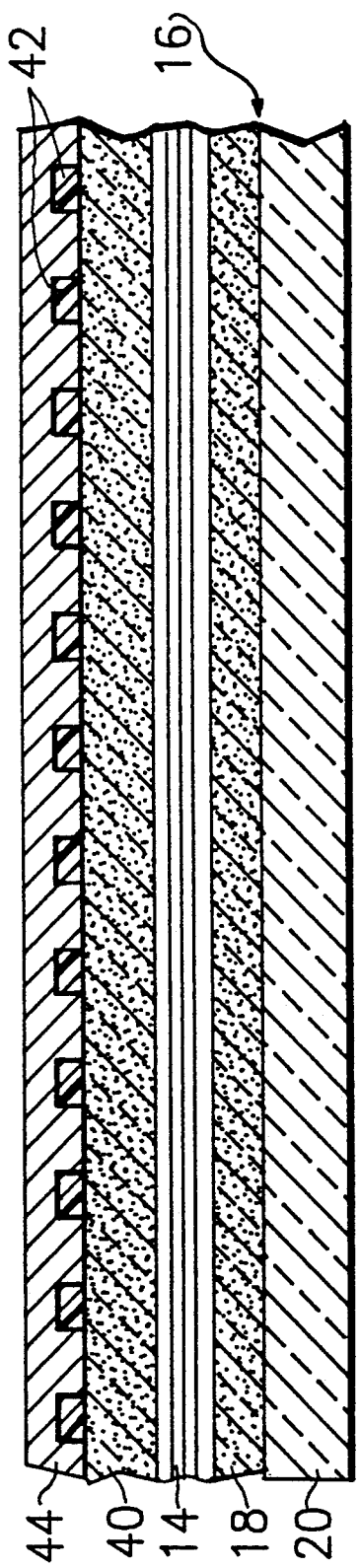
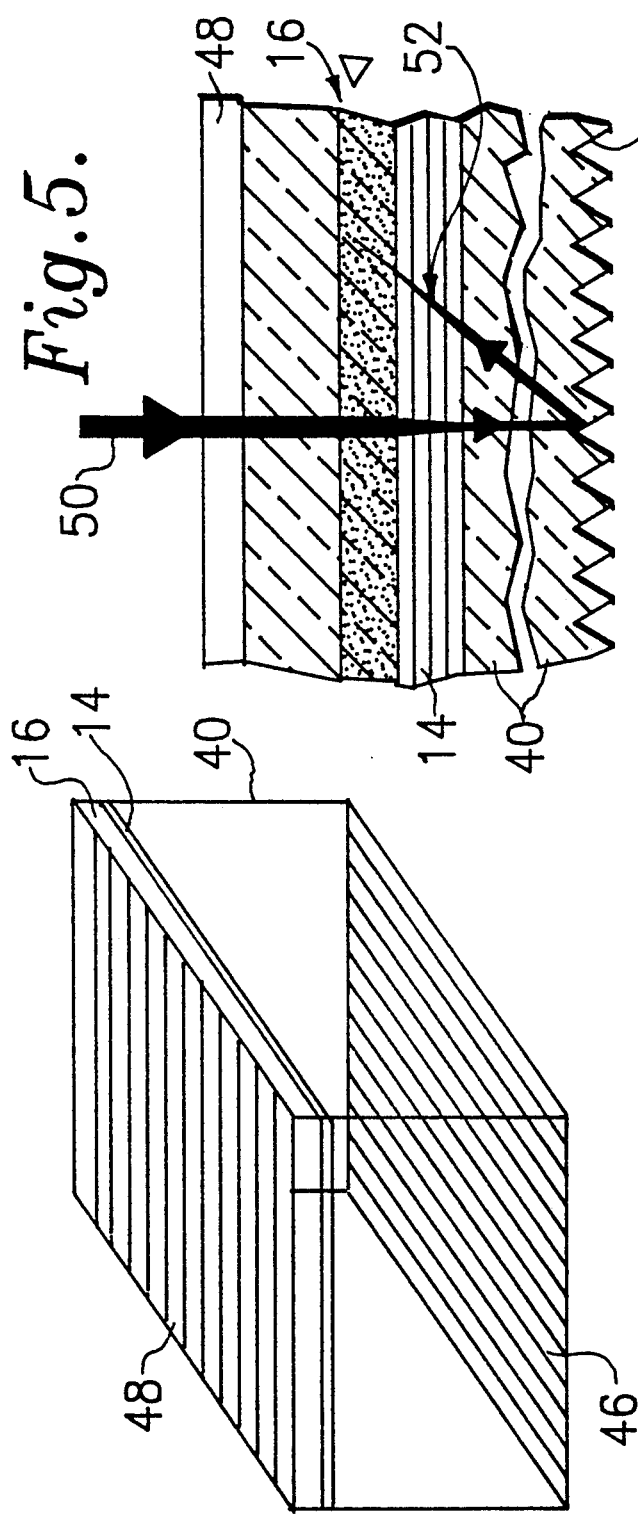

HIGH EFFICIENCY MULTIPLE QUANTUM WELL STRUCTURE AND OPERATING METHOD

BACKGROUND OF THE INVENTION

1. Field of the Invention

This invention deals with multiple quantum well photodetectors intended for unpolarized light detection.

2. Description of the Related Art

A variety of photodetectors have been developed that are useful for focal plane arrays and other applications. They may generally be classified as intrinsic semiconductor, extrinsic semiconductor and multiple quantum well devices. Each type of device, however, has certain limitations to its usefulness.

Photodetectors made from intrinsic semiconductor materials face severe material stability and produceability problems, especially if they are used to detect radiation with a wavelength greater than 10 microns. Current technology requires the use of HgCdTe to achieve an infrared detection capability, which is highly desirable. An example of this type of photodetector is discussed in Reidel, et al., "High Performance Photovoltaic Infrared Devices in $Hg_{1-x}Cd_xTe$ on Sapphire", *Applied Physics Letters*, Vol. 46, No. 1, Jan. 1, 1985, pages 64–66. While mercury (Hg) is highly volatile, it is necessary to add more and more mercury to the semiconductor to obtain narrow band detection. It is quite difficult to control the mercury in many applications, resulting in non-uniform detection pixels.

Intrinsic semiconductor photodetectors generally exhibit large bandgaps, and thus can detect only high energy photons; low energy photons essentially see a transparent structure. Extrinsic semiconductor photodetectors add a dopant, such as gallium or arsenic for a silicon photodetector, to reduce the bandgap and achieve sensitivity to low energy photons. However, an optimization of detector sensitivity to specific wavelengths is restricted because of a limited availability of allowable dopant species. Furthermore, in practice it is difficult to establish and maintain the current dopant level, and to keep the dopant pure.

A different photodetector that offers more flexibility than semiconductor detectors is the one-dimensional multiple quantum well. In this type of device, the operating characteristics are controlled by the width and height of the wells, rather than by selecting from limited available materials. A multiple quantum well detector can be very thin, on the order of a micron or less, making it much more radiation hard than either intrinsic or extrinsic semiconductor detectors.

Multiple quantum well detectors are formed from superlattice stacks of ultrathin semiconductor layers, typically Group III-V semiconductors. With these materials the energy bandgap is direct, permitting light to be efficiently emitted or absorbed without the aid of lattice vibrations. Input photons transfer energy to electrons in the well, exciting the electrons from a ground state, while an electric field moves the electrons laterally. The materials are characterized by large charge carrier mobilities, and are easily doped with impurities. They can form solid solutions of various proportions with identical crystal structures and well-matched lattice parameters, but with different energy bandgaps and indices of refraction.

One type of superlattice is the "doping superlattice", which is obtained by periodically alternating n and p doping during the growth of an otherwise uniform semiconductor such as gallium arsenide. A basic discussion of this n-i-p-i structure is given in an article by Klaus Ploog and Gottfried H. Dohler, "Compositional and Doping Superlattices in III-V Semiconductors", *Advances in Physics*. Vol. 32, No. 3, 1983, pages 285–359. This article presents a general discussion of n-i-p-i structures, as well as the spatial control of optical absorption by a voltage pattern applied to the n-i-p-i structure. Other articles which describe specific quantum well structures are:

Choi et al., "Multiple Quantum Well 10 $\mu$m GaAs-/$Al_xGa_{1-x}$As Infrared Detector With Improved Responsivity", *Applied Physics Letters*. Vol. 50, No. 25, 22 June 1987, pages 1814–16.

Levine et al., "High-Detectivity $D^* = 1.0 - \times 10^{10}$ cm/Hz/W GaAs/AlGaAs Multiquantum Well $\lambda = 8.3$ $\mu$m Infrared Detector", *Applied Physics Letters*, Vol. 53, No. 4, 25 July 1988, pages 296–98.

Levine et al., "Bound-To-Extended State Absorption GaAs Superlattice Transport Infrared Detectors", *Journal of Applied Physics*. Vol. 64, No. 3, 1 August 1988, pages 1591–93.

While one-dimensional multiple quantum well photodetectors made of heterojunction material provide flexibility in performance optimization for long wavelength infrared detection, especially in the greater than 10 micron wavelength range, the quantum efficiency of these devices is limited for unpolarized light detection. This is because these devices are not sensitive to optical polarization parallel to the detector plane. To excite an electron in a well, the electric field associated with the photons must be perpendicular to the vertical barrier walls (in the first order).

Ideally, the light to be detected would be directed onto the detector at 90° to the detector plane, to obtain the best image. However, since the plane of polarization for a light beam is normal to its direction of propagation, this would place the polarization plane parallel to the detector plane, so that it could not be detected. To compensate for this, the light is normally directed onto the detector at an angle to the detector plane which is sufficiently small so that a substantial component of the polarization is perpendicular to the detector plane and thus absorbed, but at an angle great enough to preserve adequate image clarity. In practice, an incident angle of about 45° has been used for this purpose.

Since the component of the incoming beam having a polarization parallel to the detector plane will not be absorbed by the multiple quantum well detector, an inefficiency is built into the system. As the angle of the beam to the detector plane increases, a thicker detector is necessary to retain even the same partial level of absorption. However, thick detectors are undesirable because they are less radiation hard, and require a higher operating bias voltage.

SUMMARY OF THE INVENTION

The purpose of the present invention is to provide a high efficiency multiple quantum well structure, and an associated operating method, which can achieve up to 100% absorption of unpolarized light, is sensitive to relatively long wavelengths (exceeding 10 microns), offers design flexibility, and has the potential of integrating a focal plane detector array with trans-impedance amplifiers on a common substrate.

According to the invention, radiation which is transmitted through a multiple quantum well superlattice structure with a polarization parallel to the superlattice is reflected back through the superlattice with its polarization shifted to a substantially non-parallel angle to the superlattice. This enables the superlattice to absorb at least part of the reflected radiation during its second pass. The reflection mechanism is preferably an optical grating formed on a back substrate for the superlattice, and consisting either of a reflective sawtooth surface or a periodic reflective grating pattern.

The incoming light is initially brought into the detector at an angle such that a substantial portion of the light, perhaps about 50%, is detected during the first pass prior to reflection. For this purpose, the light can be directed onto the detector at an appropriate angle, such as 45°. Alternately, for incident light normal to the detector, an angular shifting mechanism such as an optical transmission grating can be provided on the input side of the detector to shift the light to an appropriate angle. The transmission grating is oriented at a cross-angle to the reflection grating to obtain the desired non-parallelism between the reflected beam polarization and the superlattice plane.

These and other features and advantages of the invention will be apparent to those skilled in the art from the following detailed description, taken together with the accompanying drawings, in which:

DESCRIPTION OF THE DRAWINGS

FIGS. 4a–4c are vector diagrams illustrating an optical beam and its polarization at successive stages during processing through a multiple quantum well structure of the invention;

FIG. 5 is a partial sectional vieW of another embodiment of the invention;

FIG. 6 is a partially transparent perspective view of a further embodiment of the invention with both front and back gratings; and FIG. 7 is a fragmentary sectional view illustrating the processing of an optical beam with the embodiment of FIG. 6.

DETAILED DESCRIPTION OF THE INVENTION

Figure 1:
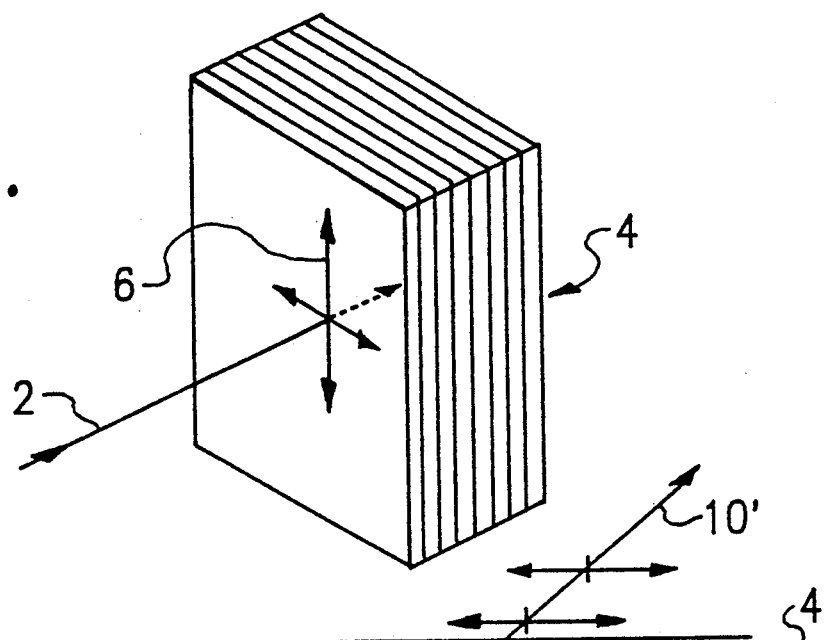
FIG. 1 is an illustrative perspective view of an optical beam directed normal to a multiple quantum well superlattice.

As mentioned above, a multiple quantum well superlattice will not detect light that is polarized parallel to the plane of the superlattice. This is illustrated in FIG. 1, in which an optical beam 2 is shown incident upon a multiple quantum well superlattice 4 at a right angle. (The term "optical" is used in its broad sense as including infrared and other regions of the electromagnetic spectrum which a multiple quantum well may detect, and is not limited to visible light.) The beam's plane of polarization, illustrated by arrows 6, is perpendicular to the beam, and thus parallel to the plane of the superlattice 4. Since all the photons are polarized in the plane of the superlattice, the beam will not be absorbed in the superlattice, and will instead be transmitted through undetected.

Figure 2:
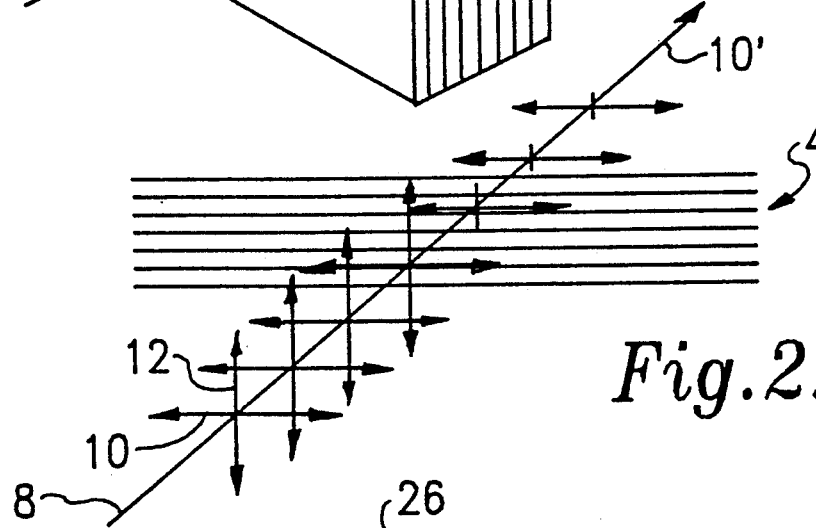
FIG. 2 is an illustrative perspective view showing the progress of an optical beam at an angle through a multiple quantum well superlattice.

The prior technique of directing a beam at a finite acute incident angle to the multiple quantum well superlattice is represented for purposes of the invention in FIG. 2. The photons of an unpolarized optical beam 8 can be represented by two orthogonal polarization vectors in an arbitrary direction normal to the direction of propagation. For a beam with a 45° incident angle, the polarization vectors can be represented by vector arrows 10 and 12, which lie respectively in planes parallel and perpendicular to the superlattice 4. The photons polarized perpendicular to the superlattice in plane 12 will be absorbed as the beam progresses through the superlattice (assuming the superlattice is sufficiently thick), while the photons polarized in plane 10 parallel to the superlattice will not interact with the one-dimensional quantum well detector. The output beam after transmission through the superlattice will thus be linearly polarized along a vector 10' which is parallel to the superlattice. Since this component of the beam has gone wholly undetected, the maximum achievable quantum efficiency of this multiple quantum well photodetector is 50%.

Figure 3:
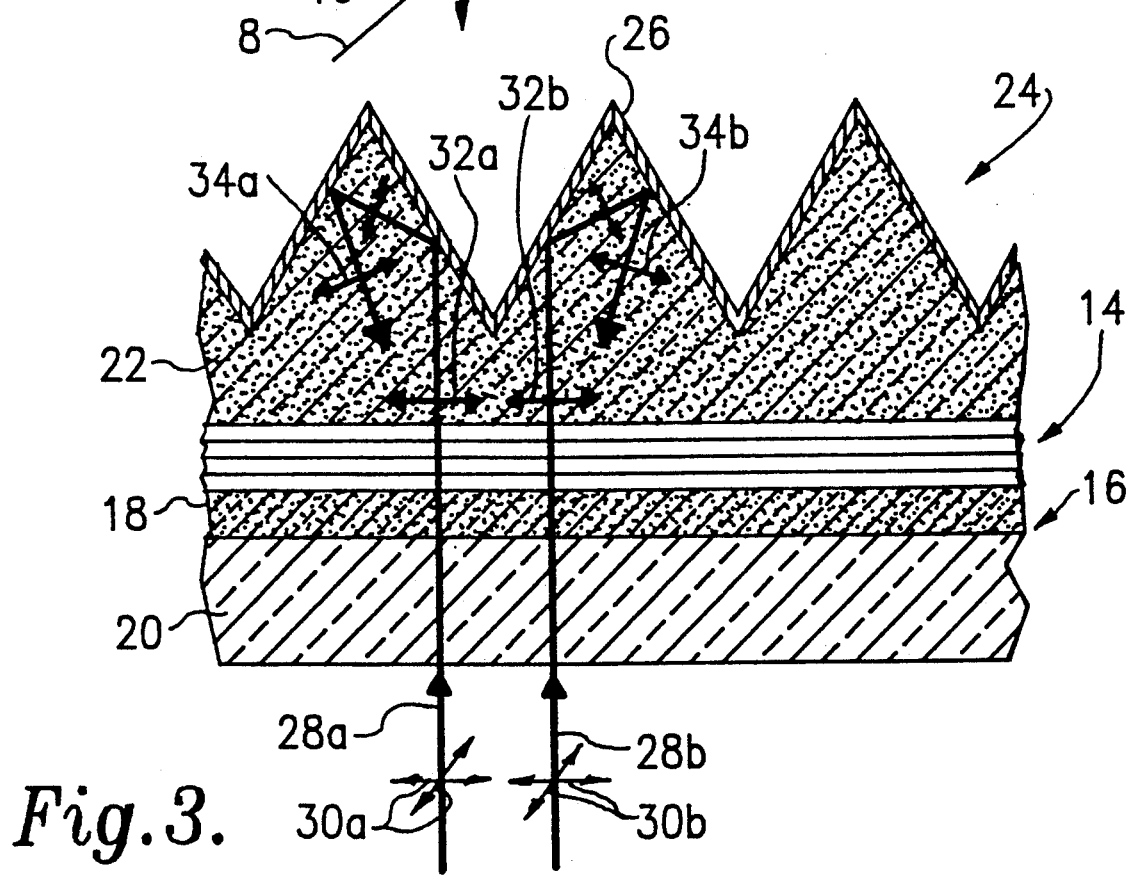
FIG. 3 is a partial sectional view of a multiple quantum well structure in accordance with the invention.

One embodiment of the invention which potentially yields up to 100% absorption, and thus 100% detection, is shown in FIG. 3. It operates by returning the portion of an incident beam which is transmitted through the superlattice back in a second pass through the superlattice, at a shifted angle such that the initially transmitted portion of the beam is absorbed during the second pass. A one-dimensional multiple quantum well superlattice 14 is fabricated on a front substrate 16, such as by epitaxially growing multilayer $Ga_xAl_{1-x}As/GaAs$ layers on a semi-insulating GaAs substrate 16. The upper substrate portion 18 is heavily doped to provide an electrical contact to the front side of the superlattice, while the lower substrate portion 20 may be semiinsulating (intrinsic). The substrate material is essentially transparent to long wavelength beams with wavelengths exceeding 10 microns, while the multiple quantum well 14 is sensitive to radiation within this range of wavelengths. The device could be made sensitive to other wavelengths by a suitable selection of materials.

A back substrate 22 is formed on the opposite side of superlattice 14 from the front substrate 16. Back substrate 22 is also formed from GaAs for long wavelength applications, and is heavily doped to provide a back electrical contact to the superlattice. The rear of the back substrate 22 is provided with a reflective optical grating, which in this embodiment is a sawtooth etch 24 with a reflective coating 26 such as titanium or possibly gold on its rear surface. Grating 24 is oriented such that it reflects incoming radiation which has been transmitted through superlattice 14 at a shifted angle whereby the radiation is absorbed by the superlattice on its second pass.

A simplified illustration of this operation is given by optical beams 28a and 28b in FIG. 3. The beams are initially unpolarized, and are assumed to strike the detector at an angle of 45° either into or out of the page. The lack of polarization is indicated by the orthogonal polarization vectors 30a, 30b.

During passage through the superlattice 14, the components of the beams having a polarization non-parallel to the superlattice will be absorbed and detected, while the remainder of the beams emerge from the superlattice with linear polarizations, indicated by polarization vectors 32a, 32b. The grating 24 is arranged to reflect the beams at a cross-angle to their 45° direction into or out of the page, such that the beams after reflection have polarizations which are no longer parallel to the superlattice, as indicated by polarization vectors 34a, 34b. Since the beams are now linearly polarized, they are progressively absorbed as they travel through the superlattice 14 on a second pass. If the superlattice is thick enough the beams will be totally absorbed, yielding a maximum optical detection. Even if the superlattice is not thick enough for total absorption, the total amount of absorption for both passes will be significantly greater than that achieved during the first pass by itself.

In a preferred embodiment, if the superlattice is assumed to have a (100) orientation, the grating is etched along the (011) direction so that the (111) planes forming the reflecting surfaces make an angle of 54° with the (100) plane. With this geometry, the beams will meet the superlattice at an angle of 36° to the superlattice plane during the second absorption pass. The photon induced current may be detected with a trans-impedance amplifier (not shown) that may also be fabricated on the same substrate.

The progress of a beam through the multiple quantum well structure is illustrated in a different format in FIGS. 4a, 4b and 4c. In each figure the lower beam vector represents an elevation view, while the upper beam vector represents a top plan view.

In FIG. 4a, a beam 36a is shown at an incident angle of about 45° to the multiple quantum well superlattice 14. It has an associated plane of polarization 38a which is normal to the beam, and also at a 45° angle to the plane of the superlattice. The beam 36b which emerges from the superlattice is illustrated in FIG. 4b. It is linearly polarized, with the polarization vector 38b parallel to the plane of the superlattice 14 and still perpendicular to the beam. The length of beam vector 36b in FIG. 4b is less than that of beam vector 36a in FIG. 4a, indicating that the beam has been partially absorbed during its first pass through the superlattice.

The beam orientation after reflection by the back grating is illustrated in FIG. 4c. The polarization vector 38c is still perpendicular to the beam 36c, but because the beam has been reflected at a cross-angle to its original direction, preferably 90°, the polarization vector 38c is now non-parallel to the superlattice plane. Thus, the reflected beam 36c is progressively absorbed as it transits the superlattice 14.

Various types of alternate gratings may be used in place of the etched grating 24 of FIG. 3. For the general purposes of the invention, any structure that shifts the angle of the optical beam after its first pass through the multiple quantum well superlattice from a polarization parallel to the superlattice to a nonparallel polarization may be used for the "grating". One such alternate configuration is shown in FIG. 5, in which elements common to the embodiment of FIG. 3 are identified by the same reference numerals. Instead of an etched back substrate, a planar back substrate 40 is used. As in FIG. 3, the back substrate is a heavily doped semiconductor such as GaAs to provide transparency and an electrical contact to the rear of the superlattice 14. The optical grating consists of a series of deposited metal or dielectric strips 42 on the rear surface of back substrate 40. The pitch of the grating should be on the order of the beam wavelength to obtain a grating effect which shifts the angle of the incoming beam. The angle of reflection depends upon the ratio of the grating pitch to the beam wavelength, in accordance with well known grating optics. A layer of reflective material 44, such as titanium or gold, is laid down over the back substrate 40 and grating 42 to provide the necessary reflection for the beam's second pass through the superlattice 14.

The embodiments of FIGS. 3 and 5 assume that the beam is independently brought into the multiple quantum well structure at a cross-angle to the angular shift introduced by the grating. An alternate structure which operates upon a beam which is initially normal to the superlattice plane is shown in FIGS. 6 and 7. Again, elements common to the previously discussed embodiments are identified by the same reference numerals.

The structure has a multiple quantum well superlattice between a front substrate 16 and a back substrate 40, with a reflective grating 46 on the opposite side of the back substrate. The front surface of the front substrate 16 is provided with a second grating 48 which is oriented at a cross-angle to the back grating 46. Front grating 48 is transmissive, and may be formed either by etching, the deposit of periodic grating strips at a pitch which preferably yields a deflection angle of 45° at the wavelength of interest, or any other suitable grating structure. If a deposited grating is used, it should be formed from a material that is transparent at the wavelength of interest, such as $SiO_2$ for infrared.

The operation of this embodiment is illustrated in FIG. 7. An input beam 50 is assumed to be initially perpendicular to the plane of the superlattice 14. It is deflected, preferably by 45° into or out of the page, at the front grating 48. This causes a component of its polarization to be shifted vertical to the superlattice, and thus absorbed during the first pass through the superlattice. This partial beam absorption is indicated by the progressive narrowing of beam 50 during its first pass through the superlattice.

After emerging from the superlattice with a linear polarization parallel to the superlattice (and lying in the plane of the page for FIG. 7), the beam is reflected off back grating 46 at a cross-angle, which shifts its linear polarization to an orientation which is non-parallel to the superlattice, as in the illustration of FIG. 3. The reflected beam is now progressively absorbed during its second pass through the superlattice, as indicated by the further progressive narrowing of the beam in region 52. Ideally, the beam is totally absorbed during its second pass.

As a specific example, for radiation of about 10 microns a deposited grating pitch of about 10 microns would be used, while for an etched grating a pitch of about 20 microns is suitable because of the etched grating's reflection angle. The width of the quantum well is about 40–50 Angstroms, with AlGaAs barriers and a barrier height on the order of 150 meV. GaAs can be used for the substrates, and doped with silicon to establish contacts with the superlattice.

The multiple quantum well structure described above is less volatile and more uniform than intrinsic semiconductor detectors, easier to manufacture and more predictable than extrinsic semiconductor photodetectors, and considerably more efficient than prior one-dimensional multiple quantum well detectors. While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A high efficiency, multiple quantum well structure comprising:

a multiple quantum well superlattice structure;

means for reflecting radiation which is transmitted through said superlattice structure with a polarization parallel to said superlattice structure, back through said superlattice structure with its polarization shifted to a substantially non-parallel angle to said superlattice structure, thus enabling said superlattice structure to absorb at least part of said reflected radiation; and means for shifting the angle of received radiation, said means being positioned on the opposite side of said superlattice structure from said radiation reflecting means, wherein said means for shifting the angle of received radiation is oriented to shift received radiation at a cross-angle to the angular shift of said reflection means.

2. The multiple quantum well structure of claim 1, said reflecting means comprising an optical grating.

3. The multiple quantum well structure of claim 2, said optical grating comprising a back substrate along said superlattice structure with a reflective sawtooth surface opposite to said superlattice structure.

4. The multiple quantum well structure of claim 2, said optical grating comprising a back substrate along said superlattice structure with a periodic reflective grating pattern deposited thereon.

5. The multiple quantum well structure of claim 1, wherein said cross-angle is substantially 90°.

6. The multiple quantum well structure of claim 1 said angle shifting means comprising an optical transmission grating.

7. A high efficiency, multiple quantum well structure, comprising:

a front substrate which is substantially transparent to radiation at a wavelength of interest;

a multiple quantum well superlattice structure formed on said front substrate;

a back substrate formed on the opposite side of said superlattice structure from said front substrate and substantially transparent to radiation at said wavelength of interest;

reflection means formed on said back substrate for reflecting radiation at said wavelength of interest which is received from said superlattice structure with a polarization parallel to said superlattice structure, said reflecting means shifting the angle of said radiation and reflecting it back through said superlattice with its polarization at a substantially non-parallel angel to said superlattice structure, thus enabling said superlattice structure to absorb at least part of said reflected radiation; and means for shifting the angle of received radiation, said means being positioned on said front substrate, wherein said means for shifting the angle of received radiation is oriented to shift received radiation at a cross-angle to the angular shift of said reflection mean.

8. The multiple quantum well structure of claim 7, said reflection means comprising a reflective optical grating.

9. The multiple quantum well structure of claim 7, wherein said cross-angle is substantially 90°.

10. The multiple quantum well structure of claim 7, said radiation angle shifting means comprising a transmissive optical grating.

11. A method of processing unpolarized radiation through a multiple quantum well superlattice structure, comprising:

transmitting said radiation in a first pass through said superlattice structure at an angle such that a first component of said radiation is polarized perpendicular to said superlattice and is at least partially absorbed thereby, and a second component of said radiation is polarized parallel to said superlattice structure and is substantially transmitted thereby, reflecting radiation transmitted through said superlattice structure at a shifted angle such that radiation polarized parallel to said superlattice structure in said first pass is polarized at a substantially non-parallel angle to said superlattice structure, and transmitting said reflected radiation back through said superlattice structure in a second pass, wherein said transmitted radiation is reflected at a cross-angle to the angle at which it is transmitted through said superlattice structure, so that radiation polarized parallel to said superlattice structure during said first pass is at least partially absorbed by said superlattice structure during said second pass.

12. The method of claim 11, wherein said cross-angle is substantially 90°.

13. The method of claim 11, further comprising the step, prior to said first pass, of shifting the angle of received radiation which is normal to said superlattice structure to an angle at which a substantial portion of said radiation is absorbed by said superlattice structure during said first pass.

14. The method of claim 13, wherein the angle of said received radiation is shifted at a cross-angle to the angle at which said transmitted radiation is shifted.

15. The method of claim 14, wherein said cross-angle is substantially 90°.

* * * * *